United States Patent
Matsushita et al.

(10) Patent No.: US 9,444,032 B2
(45) Date of Patent: Sep. 13, 2016

(54) PIEZOELECTRIC ELEMENT AND METHOD OF PRODUCING THE SAME

(71) Applicants: DENSO CORPORATION, Kariya, Aichi-pref. (JP); National University Corporation TOYOHASHI UNIVERSITY OF TECHNOLOGY, Toyohashi-shi, Aichi (JP)

(72) Inventors: Noriyuki Matsushita, Nagoya (JP); Hiroyuki Wado, Toyota (JP); Makoto Ishida, Toyohashi (JP); Daisuke Akai, Toyokawa (JP)

(73) Assignees: DENSO CORPORATION, Kariya (JP); National University Corporation TOYOHASHI UNIVERSITY OF TECHNOLOGY, Toyohashi-shi (JP)

(*) Notice: Subject to any disclaimer, the term of this patent is extended or adjusted under 35 U.S.C. 154(b) by 270 days.

(21) Appl. No.: 14/327,890

(22) Filed: Jul. 10, 2014

(65) Prior Publication Data

US 2015/0036200 A1    Feb. 5, 2015

(30) Foreign Application Priority Data

Jul. 31, 2013   (JP) .................. 2013-158532

(51) Int. Cl.
*G02B 26/08* (2006.01)
*G02B 26/10* (2006.01)
(Continued)

(52) U.S. Cl.
CPC ......... *H01L 41/1876* (2013.01); *G02B 6/3578* (2013.01); *G02B 26/0858* (2013.01);
(Continued)

(58) Field of Classification Search
CPC .......... H01L 41/1876; H01L 41/0478; H01L 41/081; H01L 41/0815; H01L 41/29; H01L 41/297; H01L 41/316; H01L 41/318; H01L 41/319; G02B 26/0858; G02B 6/3578; G02F 2001/294; G02F 1/0131
USPC ................. 359/198.1, 199.4, 200.8
See application file for complete search history.

(56) References Cited

U.S. PATENT DOCUMENTS 5,834,803 A * 11/1998 Nashimoto ........... C23C 14/088
257/295
6,503,314 B1 * 1/2003 Li .................. C23C 16/409
106/287.19
(Continued)

FOREIGN PATENT DOCUMENTS

JP    2008-206333 A    9/2008
JP    2008-233405 A    10/2008
JP    2010-247295 A    11/2010

OTHER PUBLICATIONS

Daisuke Akai et al., "Fabrication of Pb(Zr, Ti) O films on epitaxial γ-$Al_2O_3$(001)/ Si(001) substrates" Journal of Crystal Growth 259 (2003), pp. 90-94, Toyohashi, Japan.

*Primary Examiner* — Bumsuk Won
*Assistant Examiner* — Collin X Beatty
(74) *Attorney, Agent, or Firm* — Posz Law Group, PLC

(57) ABSTRACT

A piezoelectric element includes a substrate having a first surface with a predetermined orientation; a lower electrode layered on the first surface of the substrate; a piezoelectric thin film layered on the lower electrode and having a piezoelectric body; and an upper electrode layered on the piezoelectric thin film. A voltage is to be impressed between the lower electrode and the upper electrode to deform the piezoelectric thin film. The piezoelectric thin film is epitaxially grown on the lower electrode using a physical vapor deposition or a chemical vapor deposition.

31 Claims, 3 Drawing Sheets

(51) Int. Cl.
  *G02B 26/12*   (2006.01)
  *H01L 41/187*  (2006.01)
  *H01L 41/08*   (2006.01)
  *H01L 41/297*  (2013.01)
  *G02B 6/35*    (2006.01)
  *H01L 41/047*  (2006.01)
  *H01L 41/29*   (2013.01)
  *H01L 41/316*  (2013.01)
  *H01L 41/318*  (2013.01)
  *H01L 41/319*  (2013.01)
  *G02F 1/29*    (2006.01)

(52) U.S. Cl.
  CPC ......... *H01L41/0478* (2013.01); *H01L 41/081* (2013.01); *H01L 41/0815* (2013.01); *H01L 41/29* (2013.01); *H01L 41/297* (2013.01); *H01L 41/316* (2013.01); *H01L 41/318* (2013.01); *H01L 41/319* (2013.01); *G02F 2001/294* (2013.01); *Y10T 29/42* (2015.01)

(56) References Cited

U.S. PATENT DOCUMENTS

| | | | |
|---|---|---|---|
| 7,977,853 B2* | 7/2011 | Fujii | B41J 2/161 252/62.9 PZ |
| 8,188,639 B2* | 5/2012 | Noda | H01L 41/0478 310/358 |
| 2008/0291519 A1* | 11/2008 | Maeda | G02B 26/06 359/224.1 |
| 2010/0096666 A1 | 4/2010 | Ishida et al. | |

* cited by examiner

PIEZOELECTRIC ELEMENT AND METHOD OF PRODUCING THE SAME

CROSS REFERENCE TO RELATED APPLICATION

This application is based on Japanese Patent Application No. 2013-158532 filed on Jul. 31, 2013, the disclosure of which is incorporated herein by reference in its entirety.

TECHNICAL FIELD

The present disclosure relates to a piezoelectric element and a method of producing the piezoelectric element.

BACKGROUND

It is realized to extend functionality and to make finer patterning of a variety of sensors by combining a piezoelectric element to a micro electro mechanical system (MEMS). JP 2008-206333A describes a piezoelectric thin film device equipped with a substrate, a piezoelectric thin film having a diaphragm structure supported by the substrate, and a thin film electrode which deforms the surface shape of the piezoelectric thin film by impressing voltage to the piezoelectric thin film. A multilayer film is layered on the piezoelectric thin film to make the surface flat. Furthermore, a reflective film layer which reflects light is formed on the multilayer film.

The piezoelectric thin film device is used, for example, in a MEMS scanner which projects a picture on a screen by reflecting laser light by a reflective film layer. The reflective film layer in the piezoelectric thin film device functions as a mirror part which reflects laser light. Since the reflective film layer is deformed by a deformation of the piezoelectric thin film, the focal length of a mirror part can be controlled. For this reason, it becomes possible to draw a picture with depth.

The reflective film layer is required to be flat to raise the image quality of the picture projected on the screen. The flatness of the reflective film layer is dependent on a flatness of an interface with a layer directly under the reflective film layer. The multilayer film of JP 2008-206333A is formed between the piezoelectric thin film and the reflective film layer. However, the multilayer film is formed by photoresist, and the crystallinity of the interface with the reflective film layer is not taken into consideration. For this reason, the flatness is insufficient as a piezoelectric thin film. In other words, the arithmetic average coarseness of the surface of the piezoelectric thin film cannot be made small enough.

Daisuke Akai et al, Journal of Crystal Growth 259 (2003), 90-94 describes a lead zirconate titanate (PZT) film as a piezoelectric thin film which has crystal orientation. The PZT film is formed by sol gel process. Specifically, the PZT film is formed to grow on the surface of $Al_2O_3$ (001)/Si (001) having an orientation of (001).

However, an epitaxial film which has sufficient crystallinity cannot be formed by the sol gel process. Specifically, a domain area which shows a predetermined orientation on the surface of the piezoelectric thin film cannot be enlarged enough. That is, the arithmetic average coarseness is raised by much grain boundary.

SUMMARY

According to an aspect of the present disclosure, a piezoelectric element includes: a substrate having a first surface with a predetermined orientation; a lower electrode layered on the first surface of the substrate; a piezoelectric thin film layered on the lower electrode and having a piezoelectric body; and an upper electrode layered on the piezoelectric thin film. A voltage is impressed between the lower electrode and the upper electrode to deform the piezoelectric thin film. The piezoelectric thin film is epitaxially grown on the lower electrode using a physical vapor deposition method or a chemical vapor deposition method.

Accordingly, the piezoelectric thin film can be made to grow as a high crystalline epitaxial film using the physical vapor deposition method or the chemical vapor deposition method, compared with a conventional art using a sol gel process. Therefore, the arithmetic average coarseness of the upper electrode formed as a film on the piezoelectric thin film can be also made smaller.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
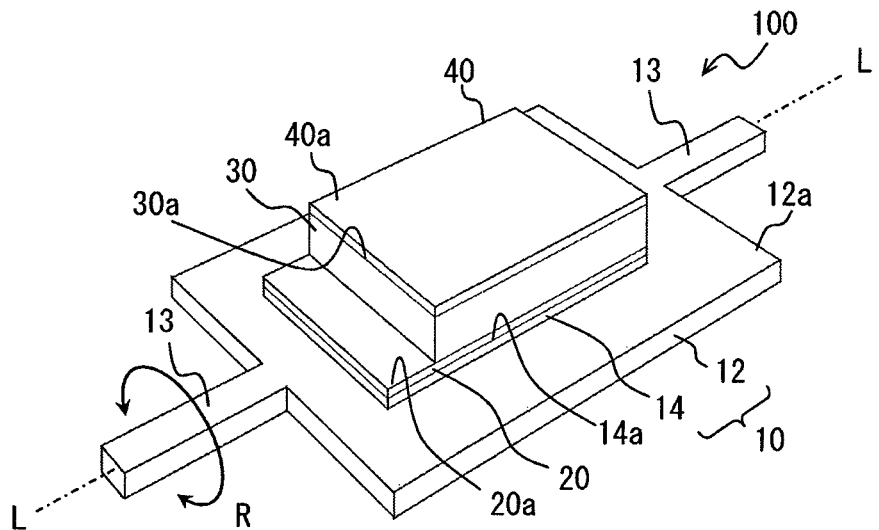
FIG. 1 is a perspective view illustrating a piezoelectric element according to a first embodiment.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A piezoelectric element 100 of a first embodiment is described with reference to FIG. 1.

As shown in FIG. 1, the piezoelectric element 100 is used for a MEMS scanner, for example. The piezoelectric element 100 includes a substrate 10, a lower electrode 20, a piezoelectric thin film 30, and an upper electrode 40.

In the MEMS scanner, a plurality of piezoelectric elements 100 are arranged in two dimensions. An incidence light traveling from a laser light source (not shown) is reflected by the upper electrode 40, and the reflected light is projected on a screen (not shown). Thereby, a picture can be displayed on the screen.

The substrate 10 has a base member 12 made of a single crystal of silicon (Si), and a buffer layer 14 made of $\gamma$-$Al_2O_3$ that is a low-temperature phase of alumina.

A generally known silicon wafer can be used as the base member 12. The base member 12 in this embodiment is a single crystal wafer having a first surface 12a. The first surface 12a of the base member 12 has an orientation of (001). Moreover, the base member 12 has two axial objects 13. The two axial objects 13 extend along a straight line L in alignment with the first surface 12a in directions opposite from each other.

The base member 12 is able to rotate in a direction of R shown in FIG. 1. The base member 12 rotates around a rotation axis corresponding to the two axial objects 13. An orientation of the upper electrode 40 is changed in accordance with a displacement of the base member 12 in the rotational direction. Thus, it is possible to change the reflective direction of incidence light.

The buffer layer 14 is made of a single crystal of $\gamma$-$Al_2O_3$. The buffer layer 14 is layered on the first surface 12a of the base member 12. The buffer layer 14 has an interface 14a (hereafter referred to a first surface 14a) adjacent to the lower electrode 20, and the first surface 14a has an orientation of (001).

The lower electrode 20 is made of a single crystal of platinum (Pt). The lower electrode 20 is layered on the first surface 14a of the buffer layer 14. The lower electrode 20 is electrically connected to a power supply (not shown), and a voltage is impressed between the upper electrode 40 and the lower electrode 20. In addition, the lower electrode 20 has an interface 20a (hereafter referred to a first surface 20a) adjacent to the piezoelectric thin film 30, and the first surface 20a has an orientation of (001).

The piezoelectric thin film 30 is made of a piezoelectric body which contains lead zirconate titanate (PZT) as a main component. The piezoelectric thin film 30 is layered on the first surface 20a of the lower electrode 20. The piezoelectric thin film 30 is deformed by impressing a voltage between the lower electrode 20 and the upper electrode 40, and the surface shape of the upper electrode 40 is changed according to the deformation of the piezoelectric thin film 30. In addition, an interface 30a (hereafter referred to a first surface 30a) of the piezoelectric thin film 30 adjacent to the upper electrode 40 has an orientation of (001).

The upper electrode 40 is made of aluminum. The upper electrode 40 is layered on the first surface 30a of the piezoelectric thin film 30. The upper electrode 40 is electrically connected to a power supply (not shown), and voltage is impressed between the lower electrode 20 and the upper electrode 40. In addition, the upper electrode 40 functions also as a mirror part which reflects the incidence light traveling from a laser light source (not shown). A first surface 40a of the upper electrode 40 not opposing to the piezoelectric thin film 30 has a specular (mirror) surface, and reflects incidence light. Furthermore, when the piezoelectric thin film 30 is deformed by the piezoelectric effect caused by the voltage impression, the surface shape of the first surface 40a is deformed so as to change the focal length as a mirror part.

The piezoelectric element 100 is mechanically connected to an actuator (not shown) via the axial body 13 of the base member 12, and is able to move in the direction of R shown in FIG. 1 around the rotation axis corresponding to the straight line L. That is, the advance direction of the reflection light irradiated from the laser light source can be controlled. Thereby, the piezoelectric element 100 functions as a scanner.

A method of producing the piezoelectric element 100 is described with reference to FIGS. 2-6.

First, the substrate 10 is prepared in a substrate preparation process.

The substrate preparation process has a process for preparing the single crystal Si as the base member 12, and a process of forming the buffer layer 14 on the base member 12a as a film made of the single crystal of $\gamma$-$Al_2O_3$.

A silicon wafer having the first surface 12a with the orientation of (001) is prepared. A natural oxidation film is removed by generally known method such as a hydrogen reduction method. Thereby, the process for preparing the base member 12 is completed. In addition, the Si single crystal in the practical environment of the substrate preparation process has diamond structure, and an interatomic distance between Si-atoms adjacent with each other is equal to the grating constant (approximately equal to 0.543 nm) on the Si (001) surface.

Figure 2:
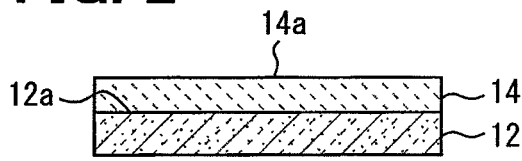
FIG. 2 is a sectional view illustrating the piezoelectric element in a substrate preparation process.

Then, the process of forming the buffer layer 14 is carried out. As shown in FIG. 2, the film of $\gamma$-$Al_2O_3$ having the thickness of about 50 nm is layered on the first surface 12a of the base member 12, i.e., the (001) surface of Si which is the base member 12, using metal organic chemical vapor deposition (MOCVD) method. In this process, the film of the buffer layer 14 is formed maintaining the base member 12 to have a temperature of about 1000° C.

According to this process, $\gamma$-$Al_2O_3$ as the buffer layer 14 can be epitaxially grown on a plane along the Si (001) surface, so that the orientation of the first surface 14a of the buffer layer 14 is set to (001).

Figure 3:
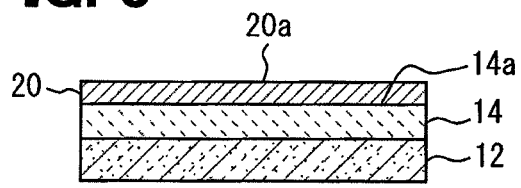
FIG. 3 is a sectional view illustrating the piezoelectric element in a lower electrode film forming process.

Subsequently, a lower electrode film forming process is carried out. As shown in FIG. 3, Pt having the thickness of about 100 nm is layered on the first surface 14a of the buffer layer 14 (surface of the substrate 10) using a sputtering method as the lower electrode 20. The lower electrode film forming process is carried out maintaining the base film (e.g., the buffer layer 14) to have a temperature of about 500° C.

According to this process, Pt as the lower electrode 20 can be epitaxially grown on a plane along the Si (001) surface, so that the orientation of the first surface 20a of the lower electrode 20 is set to (001). In addition, Pt of the lower electrode 20 has face-centered cubic lattice structure with the grating constant of about 0.392 nm.

Figure 4:
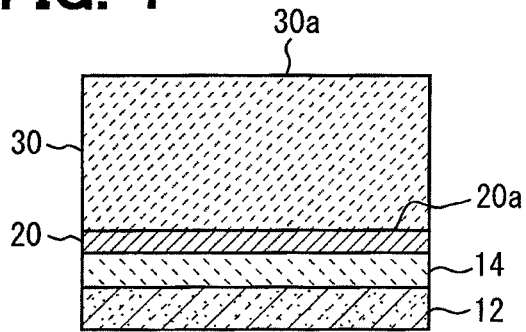
FIG. 4 is a sectional view illustrating the piezoelectric element in a piezoelectric thin film forming process.

Subsequently, a piezoelectric thin film forming process is carried out. As shown in FIG. 4, PZT as the piezoelectric thin film 30 is layered to have a thickness of about 1000 nm on the first surface 20a of the lower electrode 20 using a sputtering method. In this embodiment, the formula of PZT is $Pb(Zr_{0.48}Ti_{0.52})O_3$, for example. The piezoelectric thin film forming process is carried out maintaining the base film (e.g., the substrate 10 and the lower electrode 20) to have a predetermined temperature such as about 650° C. In addition, the piezoelectric thin film 30 formed in this process may correspond to a first epitaxial film.

According to this process, PZT as the piezoelectric thin film 30 can be epitaxially grown on a plane along the Si (001) surface, so that the orientation of the first surface 30a of the piezoelectric thin film 30 is set to (001). In other words, PZT as the piezoelectric thin film 30 has the Perovskite structure with the a-axis length of about 0.404 nm.

Therefore, the piezoelectric thin film 30 can be grown to have the first surface 30a corresponding to the (001) surface which has an interatomic distance close to the grating constant of the lower electrode 20.

Figure 5:
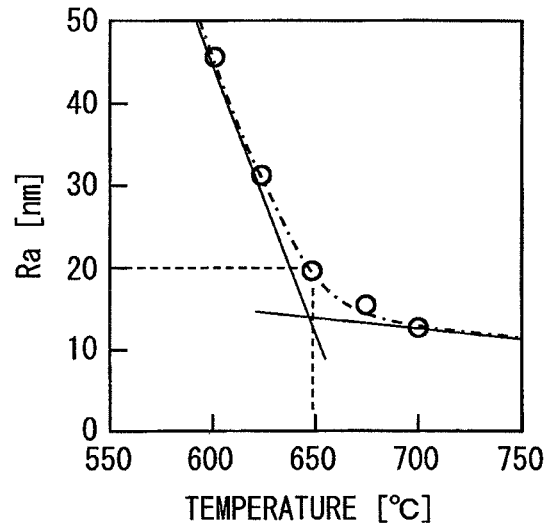
FIG. 5 is a graph illustrating a relationship between a temperature at which a piezoelectric thin film is formed and an arithmetic average coarseness Ra of the piezoelectric thin film.

Experimental results about the temperature at which the piezoelectric thin film 30 is formed in the piezoelectric thin film forming process are shown in FIG. 5. FIG. 5 illustrates a relationship between the temperature of forming the piezoelectric thin film 30 made of PZT and an arithmetic average coarseness Ra of the first surface 30a of the piezoelectric thin film 30. As shown in FIG. 5, the arithmetic average coarseness Ra becomes smaller as the temperature becomes higher. That is, it shows that the crystallinity is higher as the temperature is higher. The temperature may correspond to a temperature of the substrate 10 and/or the lower electrode 20 when the piezoelectric thin film 30 is formed.

As shown in FIG. 5, when the temperature is higher than or equal to 650° C., there is a tendency that the arithmetic average coarseness Ra is saturated. Therefore, it is desirable that the temperature is set to be not less than 650° C. when the piezoelectric thin film 30 is formed. At a point with the temperature of 650° C. in FIG. 5, the arithmetic average coarseness Ra is approximately equal to 20 (Ra≈20 nm). This is a value at which sufficient reflective efficiency of the incident light can be secured, so it is desirable that the temperature is not less than 650° C. also from a viewpoint of reflective efficiency.

If the temperature is too high, there is a possibility that Pb-atom having higher vapor pressure may disappear among the atoms composing the PZT crystal. However, the PZT epitaxially formed by the PVD method such as sputtering or the CVD method has high crystallinity, so the Pb-atom cannot easily escape from the PZT, compared with polycrystal PZT.

Thus, the predetermined film-forming temperature of the piezoelectric thin film 30 in the piezoelectric thin film forming process is set to be higher than or equal to 650° C.

Figure 6:
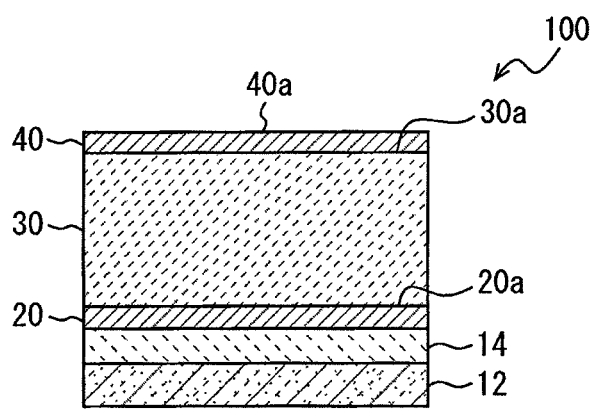
FIG. 6 is a sectional view illustrating the piezoelectric element in an upper electrode film forming process.

Subsequently, an upper electrode film forming process is carried out. As shown in FIG. 6, aluminum (Al) as the upper electrode 40 is layered to have a thickness of about 100 nm on the first surface 30a of the piezoelectric thin film 30 using sputtering method. The upper electrode 40 is affected by the crystalline of the first surface 30a of the piezoelectric thin film 30. That is, if the crystallinity of the piezoelectric thin film 30 is higher, the crystallinity of the first surface 40a along the Si (001) surface of the upper electrode 40 will also become higher.

In this embodiment, the piezoelectric thin film 30 is formed by the sputtering method at a temperature of 650° C., so the arithmetic average coarseness Ra is approximately equal to 20 nm. Therefore, compared with a case where a piezoelectric thin film is formed with polycrystal (Ra>100 nm), the crystallinity of the upper electrode 40 can be raised. In addition, at this process, while the temperature of the base film (e.g., the piezoelectric thin film 30) is not limited, if the upper electrode 40 is formed by setting the base film to have a temperature of about 25° C., the upper electrode 40 can be formed to have high surface crystallinity.

The piezoelectric element 100 can be formed through the above processes.

The crystallinity of the first surface 40a of the upper electrode 40 can be raised in the MEMS scanner using the piezoelectric element 100. For this reason, incidence light can be made difficult to be scattered on the first surface 40a, and the picture projected on the screen (not shown) can be made sharp. Moreover, the volume of light on the screen can be restricted from decreasing since the dispersion of incidence light can be controlled.

Second Embodiment

Figure 7:
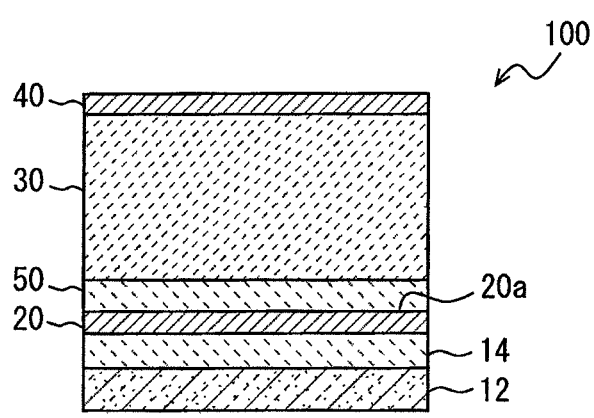
FIG. 7 is a sectional view illustrating a piezoelectric element according to a second embodiment.

As shown in FIG. 7, a piezoelectric element 100 according to a second embodiment further includes a middle layer 50 between the lower electrode 20 and the piezoelectric thin film 30, compared with the first embodiment.

The middle layer 50 may be made of $SrRuO_3$ or $LaNiO_3$, for example. If the piezoelectric thin film 30 is directly formed on the first surface 20a of the lower electrode 20, an oxygen atom in the PZT crystal of the piezoelectric thin film 30 will spread in the lower electrode 20 made of Pt, because the PZT which is an oxide. In this case, the piezoelectric characteristic will be deteriorated. In contrast, according to the second embodiment, an oxygen atom is restricted from escaping from the PZT crystal, due to the middle layer 50, so the piezoelectric characteristic can be maintained better for long time.

In addition, $SrRuO_3$ and $LaNiO_3$ are conductive oxides, and do not affect the deformation of the piezoelectric thin film 30 when a voltage is impressed between the lower electrode 20 and the upper electrode 40.

The middle layer 50 is formed in a middle layer film forming process, which is carried out after the lower electrode film forming process and before the piezoelectric thin film forming process. In the middle layer film forming process, $SrRuO_3$ or $LaNiO_3$ is layered on the first surface 20a of the lower electrode 20, for example, using sputtering method.

Third Embodiment

Figure 8:
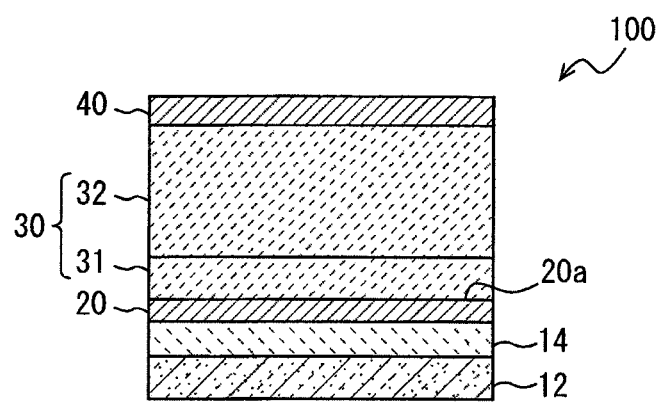
FIG. 8 is a sectional view illustrating a piezoelectric element according to a third embodiment.

As shown in FIG. 8, in a piezoelectric element 100 according to a third embodiment, the piezoelectric thin film 30 has a first epitaxial film 31 and a second epitaxial film 32. The first epitaxial film 31 is formed as a film using the sputtering method similarly to the piezoelectric thin film forming process in the first embodiment. On the other hand, the second epitaxial film 32 is formed on the first epitaxial film 31 using a sol gel process.

On the first epitaxial film 31 formed in the high crystalline state by the sputtering method, the PZT can be grown epitaxially in the high crystalline state even using the sol gel process.

The piezoelectric thin film forming process of the third embodiment has a first epitaxial film forming process and a second epitaxial film forming process. In the first embodiment, the film thickness of 2000 nm is secured only by the sputtering method, that is, the piezoelectric thin film forming process has only the first epitaxial film forming process. In the third embodiment in contrast to the first embodiment, the film thickness of about 500 nm is formed in the first epitaxial film forming process, then, the film thickness of 1500 nm is formed in the second epitaxial film forming process using the sol gel process. Thus, the cost required in the piezoelectric thin film forming process can be reduced in the third embodiment.

Other Embodiment

The lower electrode 20 may be made of Ir instead of Pt. Alternatively, $SrRuO_3$ or $LaNiO_3$ which is a conductive oxide may be used as the lower electrode 20. In case where the conductive oxide is used as the lower electrode 20, it is not necessary to form the middle layer 50.

The upper electrode 40 may be made of Pt or Ir instead of aluminum. Moreover, although the upper electrode 40 is used also as a mirror part of the MEMS scanner in the above embodiment, a thin film equivalent to the mirror part may be further formed on the upper electrode 40 independently.

Each of the thin films is formed using the sputtering method which is a kind of the physical vapor deposition method in the above embodiment. However, it is not limited to the sputtering method. Alternatively, a pulsed laser vapor-depositing method (PLD), a molecular beam epitaxy method (MBE), a metal-organic chemical vapor deposition (MOCVD), other physical vapor deposition (PVD) or other chemical vapor deposition (CVD) can be used for forming a thin film.

In the above embodiment, the PZT having the formula of $Pb(Zr_xTi_{1-x})O_3$ wherein x=0.48 is used as the main component of the piezoelectric thin film 30, because the a-axis length of 0.404 nm in the Pperovskite structure is close to 0.392 nm which is the grating constants of Pt as the lower electrode 20. However, x is not limited to 0.48 but may be in a range of $0.4 \leq x < 1$. When x is in the range of $0.4 \leq x < 1$, the a-axis length can be in a range larger than or equal to 0.388 nm and smaller than or equal to 0.405 nm. In this case, the piezoelectric thin film 30 can be easily grown epitaxially on the lower electrode 20.

The orientation of Si as the base member 12 is (001) in the above embodiment. However, it is not limited to Si, and the orientation is not limited. The buffer layer 14 is not limited to be made of $\gamma$-$Al_2O_3$. Furthermore, the orientation of the piezoelectric thin film 30 is not limited and the piezoelectric thin film 30 is not limited to be made of the PZT.

The buffer layer 14 may be made of other material such that the lower electrode 20 can be formed to have a grating constant at which the piezoelectric thin film 30 can be grown epitaxially using the PVD method and the CVD method. Moreover, the base member 12 may be made of other material or may have other orientation such that the buffer layer 14 can be formed as described above.

The upper electrode 40 corresponding to a mirror part has a rectangular shape in FIG. 1. However, the shape of the upper electrode 40 is not limited, and may have a circular shape.

Such changes and modifications are to be understood as being within the scope of the present disclosure as defined by the appended claims.

What is claimed is:

1. A piezoelectric element comprising:
   a substrate having a first surface with a predetermined orientation;
   a lower electrode layered on the first surface of the substrate;
   a piezoelectric thin film layered on the lower electrode and having a piezoelectric body; and
   an upper electrode layered on the piezoelectric thin film, the piezoelectric thin film being deformed by impressing a voltage between the lower electrode and the upper electrode,
   wherein the piezoelectric thin film is epitaxially grown on the lower electrode using a physical vapor deposition or a chemical vapor deposition at a temperature higher than or equal to 650 degrees Celsius, such that the arithmetic average coarseness Ra of the piezoelectric thin film is approximately equal to 20 nm.

2. The piezoelectric element according to claim 1, wherein
   the substrate has
      a base member comprising a single crystal of Si, and
      a buffer layer comprising a single crystal of $\gamma$-$Al_2O_3$ formed on the base member as a film,
   the lower electrode is formed on the buffer layer as a film of a single crystal, and
   the piezoelectric thin film includes a lead zirconate titanate as a main component of the piezoelectric body.

3. The piezoelectric element according to claim 2, wherein
   the base member has an interface adjacent to the buffer layer,
   the piezoelectric thin film has an interface adjacent to the upper electrode,
   the interface of the base member has an orientation of (001),
   the first surface of the substrate has an orientation of (001) by forming the buffer layer using a physical vapor deposition or a chemical vapor deposition, and
   the interface of the piezoelectric thin film has an orientation of (001) by forming the lower electrode using a physical vapor deposition or a chemical vapor deposition to have the predetermined orientation.

4. The piezoelectric element according to claim 2, wherein
   the lower electrode comprises Pt or Ir,
   the lower electrode has an interface adjacent to the piezoelectric thin film, and
   the interface of the lower electrode has an orientation of (001).

5. The piezoelectric element according to claim 4, further comprising:
   a middle layer between the lower electrode and the piezoelectric thin film, wherein the middle layer comprises $SrRuO_3$ or $LaNiO_3$.

6. The piezoelectric element according to claim 2, wherein
   the lower electrode comprises $SrRuO_3$ or $LaNiO_3$.

7. The piezoelectric element according to claim 2, wherein
   the lead zirconate titanate has a formula $Pb(Zr_xTi_{1-x})O_3$, wherein $0.4 \leq x < 1$.

8. The piezoelectric element according to claim 4, wherein
   the lead zirconate titanate has a formula $Pb(Zr_xTi_{1-x})O_3$, wherein $0.4 \leq x < 1$.

9. The piezoelectric element according to claim 5, wherein
   the lead zirconate titanate has a formula $Pb(Zr_xTi_{1-x})O_3$, wherein $0.4 \leq x < 1$.

10. The piezoelectric element according to claim 1, wherein the upper electrode is made of a metal film which reflects incidence light.

11. The piezoelectric element according to claim 2, wherein the upper electrode is made of a metal film which reflects incidence light.

12. The piezoelectric element according to claim 4, wherein the upper electrode is made of a metal film which reflects incidence light.

13. The piezoelectric element according to claim 5, wherein the upper electrode is made of a metal film which reflects incidence light.

14. The piezoelectric element according to claim 1, wherein
the piezoelectric thin film has
a first epitaxial film epitaxially grown on the lower electrode using a physical vapor deposition or a chemical vapor deposition, and
a second epitaxial film epitaxially grown on the first epitaxial film using a sol gel process.

15. The piezoelectric element according to claim 2, wherein
the piezoelectric thin film has
a first epitaxial film epitaxially grown on the lower electrode using a physical vapor deposition or a chemical vapor deposition, and
a second epitaxial film epitaxially grown on the first epitaxial film using a sol gel process.

16. The piezoelectric element according to claim 4, wherein
the piezoelectric thin film has
a first epitaxial film epitaxially grown on the lower electrode using a physical vapor deposition or a chemical vapor deposition, and
a second epitaxial film epitaxially grown on the first epitaxial film using a sol gel process.

17. The piezoelectric element according to claim 5, wherein
the piezoelectric thin film has
a first epitaxial film epitaxially grown on the lower electrode using a physical vapor deposition or a chemical vapor deposition, and
a second epitaxial film epitaxially grown on the first epitaxial film using a sol gel process.

18. A method of producing a piezoelectric element comprising:
preparing a substrate having a first surface with a predetermined orientation in a substrate preparation process;
forming a lower electrode as a film on the first surface of the substrate using a physical vapor deposition or a chemical vapor deposition in a lower electrode film forming process;
forming a piezoelectric thin film on the lower electrode using a physical vapor deposition or a chemical vapor deposition maintaining the substrate and the lower electrode to have a predetermined temperature in a piezoelectric thin film forming process, wherein the predetermined temperature is higher than or equal to 650 degrees Celsius such that the arithmetic average coarseness Ra of the piezoelectric thin film is approximately equal to 20 nm; and
forming an upper electrode as a film on the piezoelectric thin film in an upper electrode film forming process.

19. The method of producing a piezoelectric element according to claim 18,
wherein the preparing of the substrate includes forming a buffer layer made of $\gamma\text{-}Al_2O_3$ on a base member made of a single crystal of Si using a physical vapor deposition or a chemical vapor deposition in the substrate preparation process, and
the forming of the piezoelectric thin film includes forming the piezoelectric thin film comprising a lead zirconate titanate as a main component of a piezoelectric body.

20. The method of producing a piezoelectric element according to claim 19, wherein
the forming of the lower electrode includes
forming the lower electrode using Pt or Ir in the lower electrode film forming process.

21. The method of producing a piezoelectric element according to claim 20, further comprising:
forming a middle layer made of $SrRuO_3$ or $LaNiO_3$ between the lower electrode and the piezoelectric thin film, wherein
the forming of the middle layer is performed after the lower electrode film forming process and before the piezoelectric thin film forming process.

22. The method of producing a piezoelectric element according to claim 19, wherein
the forming of the lower electrode includes
forming the lower electrode using $SrRuO_3$ or $LaNiO_3$ in the lower electrode film forming process.

23. The method of producing a piezoelectric element according to claim 19, wherein
the lead zirconate titanate has a formula of $Pb(Zr_xTi_{1-x})O_3$, wherein $0.4 \leq x < 1$.

24. The method of producing a piezoelectric element according to claim 20, wherein
the lead zirconate titanate has a formula of $Pb(Zr_xTi_{1-x})O_3$, wherein $0.4 \leq x < 1$.

25. The method of producing a piezoelectric element according to claim 21, wherein
the lead zirconate titanate has a formula of $Pb(Zr_xTi_{1-x})O_3$, wherein $0.4 \leq x < 1$.

26. The method of producing a piezoelectric element according to claim 19, wherein the forming of the upper electrode includes forming the upper electrode using a metal film so that the upper electrode reflects incidence light in the upper electrode forming process.

27. The method of producing a piezoelectric element according to claim 20, wherein the forming of the upper electrode includes forming the upper electrode using a metal film so that the upper electrode reflects incidence light in the upper electrode forming process.

28. The method of producing a piezoelectric element according to claim 21, wherein the forming of the upper electrode includes forming the upper electrode using a metal film so that the upper electrode reflects incidence light in the upper electrode forming process.

29. The method of producing a piezoelectric element according to claim 19, wherein
the forming of the piezoelectric thin film includes
forming a first epitaxial film using a physical vapor deposition or a chemical vapor deposition, and
forming a second epitaxial film on the first epitaxial film using a sol gel process.

30. The method of producing a piezoelectric element according to claim 20, wherein
the forming of the piezoelectric thin film includes
forming a first epitaxial film using a physical vapor deposition or a chemical vapor deposition, and
forming a second epitaxial film on the first epitaxial film using a sol gel process.

31. The method of producing a piezoelectric element according to claim 21, wherein
the forming of the piezoelectric thin film includes
forming a first epitaxial film using a physical vapor deposition or a chemical vapor deposition, and
forming a second epitaxial film on the first epitaxial film using a sol gel process.

* * * * *